(12) United States Patent
Tang et al.

(10) Patent No.: US 11,735,674 B2
(45) Date of Patent: Aug. 22, 2023

(54) SENSOR AND METHOD FOR MANUFACTURING THE SAME

(71) Applicant: SMC Multi-Media Products Company Ltd., Foshan (CN)

(72) Inventors: Che Yin Tang, Foshan (CN); Yu Chuen Wong, Foshan (CN); Shufang Wang, Foshan (CN); Bojiu Chen, Foshan (CN)

(73) Assignee: SMC Multi-Media Products Company Ltd., Foshan (CN)

( * ) Notice: Subject to any disclaimer, the term of this patent is extended or adjusted under 35 U.S.C. 154(b) by 86 days.

(21) Appl. No.: 17/548,986

(22) Filed: Dec. 13, 2021

(65) Prior Publication Data

US 2023/0104668 A1    Apr. 6, 2023

(30) Foreign Application Priority Data

Sep. 26, 2021  (CN) .......................... 202111128295.7

(51) Int. Cl.
*H01L 31/0203* (2014.01)
*H01L 25/16* (2023.01)

(52) U.S. Cl.
CPC ........ *H01L 31/0203* (2013.01); *H01L 25/167* (2013.01)

(58) Field of Classification Search
None
See application file for complete search history.

(56) References Cited

U.S. PATENT DOCUMENTS 8,338,923 B1 * 12/2012 Hwu .................... H01L 25/0753
257/E33.066
2020/0098808 A1 * 3/2020 Wu .................... H01L 27/14627

* cited by examiner

*Primary Examiner* — Sarah K Salerno
(74) *Attorney, Agent, or Firm* — Dorsey & Whitney LLP

(57) ABSTRACT

A sensor includes: a substrate, a chip, and a protective layer. The chip is arranged on a surface of the substrate, the protective layer includes a silica gel protective layer, a silica gel active layer, and a strength-increasing protective layer. the silica gel protective layer is coated on the chip and adheres to the substrate; the silica gel active layer is coated on an outer surface of the silica gel protective layer, and adhesion of the silica gel active layer is greater than adhesion of the silica gel protective layer; the strength-increasing protective layer is coated on and adheres to an outer surface of the silica gel active layer, and the strength-increasing protective layer adheres to the substrate; and a strength of the strength-increasing protective layer is greater than a strength of the silica gel protective layer.

18 Claims, 3 Drawing Sheets

SENSOR AND METHOD FOR MANUFACTURING THE SAME

CROSS REFERENCES TO RELATED APPLICATIONS

The present application claims priority to Chinese patent application No. 202111128295.7, entitled "SENSOR AND METHOD FOR MANUFACTURING THE SAME", filed on Sep. 26, 2021, the entirety of which is incorporated herein by reference.

TECHNICAL FIELD

The present disclosure relates to the field of electronic device, more particularly relates to a sensor and a method for manufacturing the same.

BACKGROUND

Photoelectric sensors have advantages of non-contact, fast response, reliable performance and the like, and thus are widely used in various electronic products. When the sensor is exposed to the air for a long time, oxygen, moisture, dust, and temperature changes in the environment will cause the internal components of the sensor to be contaminated, oxidized and decomposed, and the optical and electrical properties of the sensor severely decrease until failure, thereby shortening the service life of the sensor. Therefore, packaging is an important technology that affects the performance and the service life of the sensor.

Single-layer adhesive packaging is mostly adopted as the structure of the conventional sensor packaging, which cannot meet the sensor's requirements for moisture-proof, dust-proof, impact resistance, abrasion resistance, and extreme temperature adaptation at the same time, seriously affecting the stabilities of the optical, mechanical and electrical properties of the sensor.

SUMMARY

Based on this, the present disclosure provides a sensor and a method for manufacturing the same, which can reduce the surface viscosity of the photoelectric sensor, improve the dust-proof, moisture-proof, abrasion-resistant and scratch-resistant performances of the photoelectric sensor, expand the applicable temperature range of the photoelectric sensor, and ensure the stabilities of the optical, mechanical and electrical properties of the sensor.

A sensor includes: a substrate, a chip, which is arranged on a surface of the substrate, and a protective layer. the protective layer includes a silica gel protective layer, a silica gel active layer, and a strength-increasing protective layer; the silica gel protective layer is coated on the chip, the silica gel protective layer adheres to the substrate, such that the chip is encapsulated in a space enclosed by the silica gel protective layer and the substrate; the silica gel active layer is coated on an outer surface of the silica gel protective layer, and adhesion of the silica gel active layer is greater than adhesion of the silica gel protective layer; the strength-increasing protective layer is coated on and adheres to an outer surface of the silica gel active layer, and the strength-increasing protective layer adheres to the substrate, such that the silica gel active layer, the silica gel protective layer, and the chip are encapsulated in a space enclosed by the strength-increasing protective layer and the substrate; and a strength of the strength-increasing protective layer is greater than a strength of the silica gel protective layer.

The above solution provides a sensor. By providing the silica gel active layer between the silica gel protective layer and the strength-increasing protective layer, the strength-increasing protective layer can reliably and stably adhere to the silica gel protective layer. The silica gel protective layer has the characteristics of anti-pollution, moisture-proof, heat resistance, impact and vibration resistance, and the strength-increasing protective layer has the characteristics of high strength, oil resistance and dust-proof, such that the protective layer encapsulating the chip can protect the chip and the internal circuits in the chip from external damage, effectively prevent pollutants and moisture in the environment from entering the internal of the chip, and resist the influence of external impacts and vibrations, thereby improving the stabilities of the optical, mechanical and electrical properties of the sensor.

In one of the embodiments, the silica gel protective layer includes an organic silica gel, the organic silica gel is coated on the chip, and the organic silica gel adheres to the substrate, such that the chip is encapsulated in a space enclosed by the organic silica gel and the substrate; and/or, a surface hardness of the silica gel protective layer is Shore A60-A80.

In one of the embodiments, the silica gel active layer is formed by applying a silica gel surface treatment agent on the outer surface of the silica gel protective layer.

In one of the embodiments, the strength-increasing protective layer includes a UV curable adhesive, the UV curable adhesive is coated on and adheres to the outer surface of the silica gel active layer, and the UV curable adhesive adheres to the substrate, such that the silica gel active layer, the silica gel protective layer and the chip are encapsulated in a space enclosed by the UV curable adhesive and the substrate.

In one of the embodiments, a surface hardness of the strength-increasing protective layer is Shore D70-D90; and/or, the strength-increasing protective layer includes an acrylic UV curable adhesive.

In one of the embodiments, the UV curable adhesive includes acrylic UV curable varnish or acrylic conformal varnish.

In one of the embodiments, the silica gel protective layer is coated on the chip and adheres to the substrate by injection molding; and/or, the silica gel active layer is coated on the silica gel protective layer by brushing or spraying, the strength-increasing protective layer is coated on the silica gel active layer and adheres to the substrate by spraying, dipping, brushing or drenching.

In one of the embodiments, a thickness of the silica gel protective layer is 0.55 mm-0.65 mm, a thickness of the silica gel active layer is 0.05 mm-0.15 mm, and a thickness of the strength-increasing protective layer is 0.1 mm-0.2 mm; and/or, a refractive index of the protective layer is 1.4-1.8, a temperature resistance range of the protective layer is −30° C.–280° C., and abrasion resistance of the protective layer is RCA for 500 times under 175 g force.

In one of the embodiments, the chip is a photoelectric chip.

A method for manufacturing the sensor, includes: mounting the chip on the substrate; coating the silica gel protective layer on the chip, the silica gel protective layer adheres to the substrate, such that the chip is encapsulated in the space enclosed by the silica gel protective layer and the substrate; coating the silica gel active layer on the outer surface of the silica gel protective layer; and coating the strength-increasing protective layer on the outer surface of the silica gel active layer, and the strength-increasing protective layer adheres to the substrate, such that the silica gel active layer, the silica gel protective layer, and the chip are encapsulated in a space enclosed by the strength-increasing protective layer and the substrate.

The above solution provides a method for manufacturing a sensor. By providing the silica gel active layer between the silica gel protective layer and the strength-increasing protective layer, the strength-increasing protective layer can reliably and stably adhere to the silica gel protective layer. The silica gel protective layer has the characteristics of anti-pollution, moisture-proof, heat resistance, impact and vibration resistance, and the strength-increasing protective layer has the characteristics of high strength, oil resistance and dust-proof, such that the protective layer encapsulating the chip can protect the chip and the internal circuits in the chip from external damage, effectively prevent pollutants and moisture in the environment from entering the internal of the chip, and resist influence of external impacts and vibrations, thereby improving the stabilities of the optical, mechanical and electrical properties of the sensor.

Figure 1:
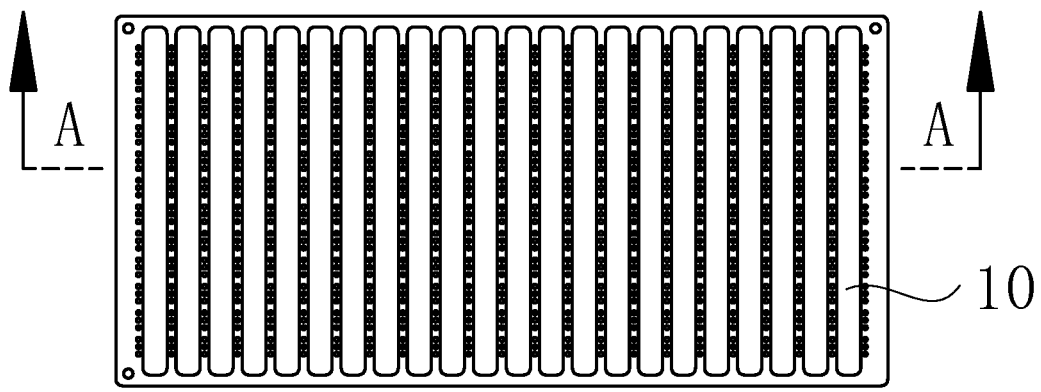
FIG. 1 is a view of a sensor viewed at a visual angle.
Figure 2:
FIG. 2 is a cross-sectional view of the sensor shown in FIG. 1 taken from A-A.

Reference numerals: 10. sensor; 11. substrate; 12. chip; 13. protective layer; 14. silica gel protective layer; 15. silica gel active layer; 16. strength-increasing protective layer.

DETAILED DESCRIPTION OF THE EMBODIMENTS

In order to make the above purposes, features and advantages of the present disclosure more apparent and better understood, embodiments of the present disclosure will be fully described hereinafter with reference to the accompanying drawings. In the following description, many specific details are explained in order to fully understand the present disclosure. However, the present disclosure can be implemented in many other ways than those described herein, and such modifications may be made by those skilled in the art without departing from the scope of the disclosure, which is therefore not to be limited to the specific embodiments disclosed below.

As shown in FIGS. 1 to 4, a sensor 10 according to an embodiment of the present disclosure includes a substrate 11, a chip 12, and a protective layer 13.

The substrate 11 is configured to support the chip 12, and the chip 12 is mounted on a surface of the substrate 11. The protective layer 13 is coated on the chip 12 to cover the chip 12 and adheres to the substrate 11. That is, the chip 12 is encapsulated in a space enclosed by the protective layer 13 and the substrate 11 to protect the chip 12 and the internal circuits in the chip 12 from external damage, effectively prevent pollutants and moisture in the environment from entering the internal of the chip 12, and resist influence of external impacts and vibrations, thereby improving the stabilities of the optical, mechanical and electrical properties of the sensor 10. In the present disclosure, a layer being coating on another component means that the layer is form on that component to cover that component.

Figure 3:
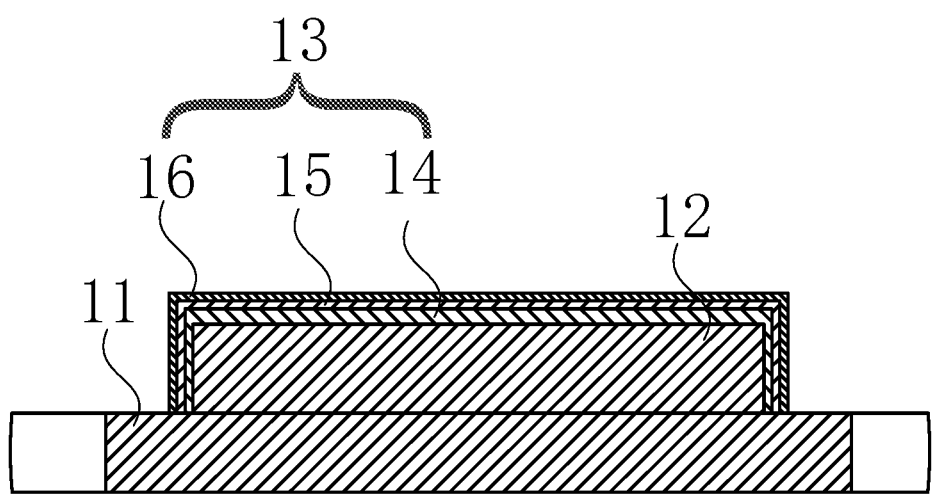
FIG. 3 is an enlarged view at area B of the sensor shown in FIG. 2.
Figure 4:
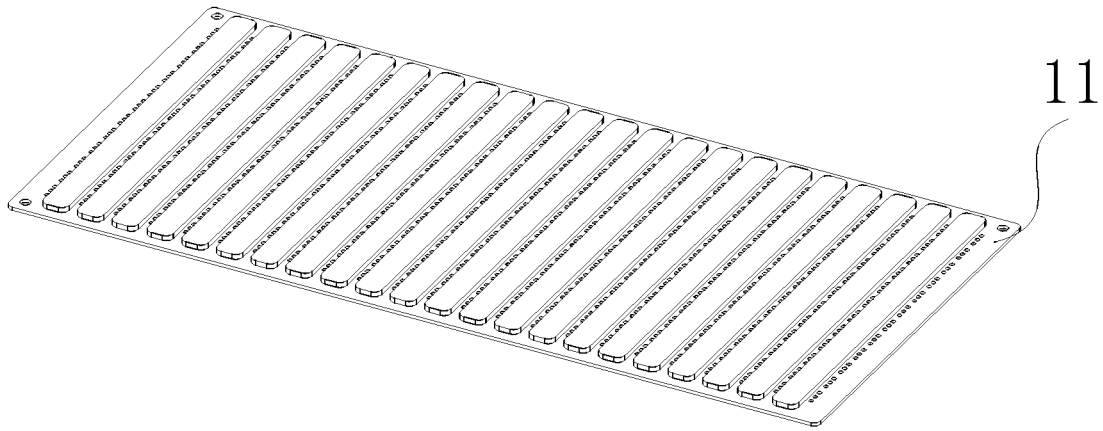
FIG. 4 is a view of the sensor viewed at another visual angle.

Further, as shown in FIG. 3, the protective layer 13 includes a silica gel protective layer 14, a silica gel active layer 15, and a strength-increasing protective layer 16. The silica gel protective layer 14 is coated on the chip 12 and adheres to the substrate 11, that is, the chip 12 is encapsulated in a space enclosed by the silica gel protective layer 14 and the substrate 11. The silica gel active layer 15 is coated on an outer surface of the silica gel protective layer 14, that is, the outer surface of the silica gel protective layer 14 is completely covered by the silica gel active layer 15. The strength-increasing protective layer 16 is coated on an outer surface of the silica gel active layer 15. The outer surface of the silica gel active layer 15 is completely covered by the strength-increasing protective layer 16, and the strength-increasing protective layer 16 adheres to the substrate 11, such that the silica gel active layer 15, the silica gel protective layer 14, and the chip 12 are encapsulated in a space enclosed by the strength-increasing protective layer 16 and the substrate 11.

The silica gel active layer 15 has adhesion greater than that of the silica gel protective layer 14. Increasing the surface adhesion of the silica gel protective layer 14 can ensure the reliability of the coating of the strength-increasing protective layer 16 on an outer surface of the sensor 10.

The strength-increasing protective layer 16 has a strength greater than that of the silica gel protective layer 14. Increasing the surface strength of the sensor 10 and reducing the surface adhesion of the sensor 10 can thereby improve the dust-proof, abrasion-resistant and scratch-resistant performances of the surface of the sensor 10 and improve the surface quality of the sensor 10, which is convenient for subsequent processing.

According to the sensor 10 provided by the embodiment of the present disclosure, by providing a silica gel active layer 15 between the silica gel protective layer 14 and the strength-increasing protective layer 16, the strength-increasing protective layer 16 can reliably and stably adheres to the silica gel protective layer 14. The silica gel protective layer 14 has the characteristics of anti-pollution, moisture-proof, heat resistance, impact and vibration resistance, and the strength-increasing protective layer 16 has the characteristics of high strength, oil resistance and dust-proof, such that the protective layer 13 encapsulating the chip 12 can protect the chip 12 and the internal circuits in the chip 12 from external damage, effectively prevent pollutants and moisture in the environment from entering the internal of the chip 12, and resist the influence of external impacts and vibrations, thereby improving the stabilities of the optical, mechanical and electrical properties of the sensor 10.

Specifically, the silica gel protective layer 14 includes organic silica gel, the organic silica gel is coated on the chip 12, and the organic silica gel adheres to the substrate 11, such that the chip 12 is encapsulated in a space enclosed by the organic silica gel and the substrate 11.

The organic silica gel is a colorless transparent adhesive, which becomes a transparent elastomer after being cured. It can protect the chip 12 and micro-connection lines from external damage, and resist influence from environmental pollution, moisture, impact, vibration, etc., so that the chip 12 can maintain optical characteristics, physical and mechanical properties, and electrical properties under a wide range of temperature, humidity, and harsh environmental conditions. Therefore, by coating the chip 12 with silica gel and adhering the silica gel to the substrate 11, the reliability of the coating is ensured, and the optical performance of the sensor 10 is maintained, thereby effectively preventing the sensor 10 from failing in the high/low temperature extreme environment during the verification process, and ensuring the stability of the performance of the sensor 10 in the subsequent processing process.

Specifically, in an embodiment, the silica gel protective layer 14 includes a mixture containing two types of adhesives. One type of adhesive is a mixture containing methyl vinyl MQ resin, methyl polysiloxane end-capped with vinyl, and platinum catalyst, and the other type of adhesive is a mixture of methyl vinyl MQ resin, methyl polysiloxane end-capped with vinyl, methyl polysiloxane end-capped with hydrogen, adhesion promoter and inhibitor.

Specifically, in an embodiment, a viscosity of the silica gel protective layer 14 is 4700 mPa·s-7500 mPa·s.

Specifically, in an embodiment, a surface hardness of the silica gel protective layer 14 is Shore A60-A80.

More specifically, in an embodiment, the surface hardness of the silica gel protective layer 14 is Shore A71-A75.

More specifically, in an embodiment, the surface hardness of the silica gel protective layer 14 is Shore A60.

Optionally, in an embodiment, the surface hardness of the silica gel protective layer 14 is Shore A71.

Optionally, in an embodiment, the surface hardness of the silica gel protective layer 14 is Shore A73.

Optionally, in an embodiment, the surface hardness of the silica gel protective layer 14 is Shore A75.

Optionally, in an embodiment, the surface hardness of the silica gel protective layer 14 is Shore A80.

Further, the silica gel protective layer 14 is coated on the chip 12 and adheres to the substrate 11 by injection molding. Injection molding is a method of injecting molten colloid into a mold cavity at a certain temperature, and then obtaining a molded product after being cured. By coating the protective layer 14 on the chip 12 and adhering the protective layer 14 to the substrate 11 by injection molding, it is ensured that the silica gel protective layer 14 is completely bonded to the chip 12 and completely seals the chip 12 to prevent the intrusion of pollutants and moisture. It is also possible to obtain the silica gel protective layer 14 of different shapes and thicknesses by selecting the size of the mold cavity. The production speed is fast, the efficiency is high, and the production efficiency of the sensor 10 is improved.

Further, a method for the curing in injection molding includes baking at 150° C. for 20 min-30 min and then demolding.

Optionally, the method for the curing in injection molding includes heating at 150° C. for 4 h.

More specifically, in an embodiment, the silica gel active layer 15 is formed by applying a silica gel surface treatment agent on the outer surface of the silica gel protective layer 14. The silica gel surface treatment agent can improve the inertness of the surface of the silica gel protective layer 14, enhance the adhesiveness of the surface of the silica gel protective layer 14, and improve the surface adhesion of the silica gel protective layer 14, thereby ensuring the reliability of the adhesion of the strength-increasing protective layer 16.

Further, in an embodiment, the silica gel surface treatment agent includes a mixture containing an organo-silicone polymer, a cross-linking agent, a solvent, and a curing agent.

Further, in an embodiment, the silica gel active layer 15 is coated on the silica gel protective layer 14 by brushing. The brushing makes the thickness of the silica gel active layer 15 uniform, and the thickness of the silica gel active layer 15 can be adjusted by controlling the number of times of brushing. The process is simple and the processing is convenient.

Optionally, the silica gel active layer 15 is coated on the silica gel protective layer 14 by spraying. The spraying makes the thickness of the silica gel active layer uniform, and the thickness of the silica gel active layer 15 can be adjusted by controlling the number of times of spraying. The process is simple and the processing is convenient.

Further, in an embodiment, a surface hardness of the strength-increasing protective layer 16 is Shore D70-D90. The hardness of the strength-increasing protective layer 16 is high, and is higher than that of the silica gel protective layer 14, which effectively improves the surface hardness of the sensor 10 and improves the characteristics of abrasion resistance and scratch resistance of the sensor 10.

More specifically, in an embodiment, the surface hardness of the strength-increasing protective layer 16 is Shore D83-D87.

Specifically, in an embodiment, a surface hardness of the strength-increasing protective layer 16 is Shore D70.

Optionally, in an embodiment, a surface hardness of the strength-increasing protective layer 16 is Shore D83.

Optionally, in an embodiment, a surface hardness of the strength-increasing protective layer 16 is Shore D85.

Optionally, in an embodiment, a surface hardness of the strength-increasing protective layer 16 is Shore D87.

Optionally, in an embodiment, a surface hardness of the strength-increasing protective layer 16 is Shore D90.

Specifically, in an embodiment, a surface viscosity of the strength-increasing protective layer 16 is 230 mPa·s-270 mPa·s. The surface viscosity of the strength-increasing protective layer 16 is lower than the surface viscosity of the silica gel protective layer 14, which reduces the viscosity of the surface of the sensor 10 and effectively prevents dust from affecting the surface quality of the sensor 10.

Further, in an embodiment, the strength-increasing protective layer 16 includes UV curable adhesive, the UV curable adhesive is coated on and adheres to the outer surface of the silica gel active layer 15, and the UV curable adhesive adheres to the substrate 11, such that the silica gel active layer 15, the silica gel protective layer 14, and the chip 12 are encapsulated in the space enclosed by the UV curable adhesive and the substrate 11. The UV curable adhesive is a single-component ultraviolet curable adhesive. The UV curable adhesive forms a protective film on the electronic circuits and components after being cured, which can enhance the moisture-proof, dust-proof and waterproof capabilities of the electronic circuits and components, and is also conducive to the abrasion-resistance and scratch-resistance of the circuits and components, and can release the pressure caused by periodic changes in temperature. The UV curable adhesive is coated on the outer surface of the silica gel active layer 15 and adheres to the substrate 11. A layer of the UV curable adhesive is colorless and transparent, and has a relative strong hardness and a smooth surface, which can effectively prevent dust from adhering to the surface of the sensor 10 and increase the mechanical strength of the surface of the sensor 10, thereby improving the dust-proof, abrasion-resistant and scratch-resistant performances of the sensor 10.

More specifically, in an embodiment, the method for the curing of the UV curable adhesive includes curing by irradiation of an ultraviolet lamp with a wavelength of 365 nm.

Further, the strength-increasing protective layer 16 includes acrylic UV curable adhesive.

Specifically, in an embodiment, the UV curable adhesive includes acrylic UV curable varnish.

Optionally, in an embodiment, the UV curable adhesive includes acrylic conformal varnish.

Specifically, in an embodiment, the strength-increasing protective layer 16 is coated on the silica gel active layer 15 and adheres to the substrate 11 by spraying, dipping, brushing or drenching.

Optionally, in an embodiment, the strength-increasing protective layer 16 is coated on the silica gel active layer 15 and adheres to the substrate 11 by brushing. The brushing makes the thickness of the strength-increasing protective layer 16 uniform, and the thicknesses of the silica gel active layer and the strength-increasing protective layer can be adjusted by controlling the number of times of brushing. The process is simple and the processing is convenient.

Optionally, in an embodiment, the strength-increasing protective layer 16 is coated on the silica gel active layer 15 and adheres to the substrate 11 by spraying. The spraying makes the thickness of the strength-increasing protective layer 16 uniform, and the thicknesses of the silica gel active layer 15 and the strength-increasing protective layer 16 can be adjusted by controlling the number of times of spraying. The process is simple and the processing is convenient.

Specifically, in an embodiment, a thickness of the silica gel protective layer 14 is in a range of 0.55 mm-0.65 mm, a thickness of the silica gel active layer 15 is in a range of 0.05 mm-0.15 mm, and a thickness of the strength-increasing protective layer 16 is in a range of 0.1 mm-0.2 mm. The thickness of the silica gel protective layer 14 is greater than the thicknesses of the silica gel active layer 15 and the strength-increasing protective layer 16. The silica gel protective layer 14 is used to protect the chip 12 and the internal circuit structure inside the chip 12, the silica gel active layer 15 is used to increase the surface adhesion of the silica gel protective layer 14, and the strength-increasing protective layer 16 is used to increase the surface strength.

Further, in an embodiment, the thickness of the silica gel protective layer 14 is 0.55 mm. The thickness of the silica gel active layer 15 is 0.05 mm. The thickness of the strength-increasing protective layer 16 is 0.1 mm.

Further, in an embodiment, the thickness of the silica gel protective layer 14 is 0.6 mm. The thickness of the silica gel active layer 15 is 0.1 mm. The thickness of the strength-increasing protective layer 16 is 0.15 mm.

Further, in an embodiment, the thickness of the silica gel protective layer 14 is 0.65 mm. The thickness of the silica gel active layer 15 is 0.15 mm. The thickness of the strength-increasing protective layer 16 is 0.2 mm.

Further, in an embodiment, a refractive index of the protective layer 13 of the sensor 10 is 1.4-1.8. A temperature resistance range of the protective layer 13 is −30° C.−280° C. An abrasion resistance of the protective layer 13 is RCA for 500 times under 175 g force. The protective layer of the sensor 10 has a low refractive index and a high light transmittance, which can fully maintain the original optical characteristics of the chip 12. At the same time, the sensor 10 has a wide temperature resistance range and strong abrasion resistance, which prevents the sensor 10 from failing during the test verification process in the test environment such as high and low temperature impact, ensures the stability of the performance of the sensor 10, and is conducive to subsequent processing and testing.

Further, in an embodiment, the refractive index of the protective layer 13 is 1.4.

Further, in an embodiment, the refractive index of the protective layer 13 is 1.65.

Further, in an embodiment, the refractive index of the protective layer 13 is 1.8.

Specifically, in an embodiment, the chip 12 is a photoelectric chip. The photoelectric chip has the functions of optical signal generation, optical signal adjustment, optical signal processing, optical signal detection, etc. During the using process of the photoelectric chip, optical signals needs to be transmitted or received, which requires a relative high light transmittance, that is, a low refractive index, in the packaging structure for the photoelectric chip. Therefore, the packaging structure not only needs to protect the internal structure of the chip 12, and has the characteristics of moisture-proof, dust-proof, and abrasion resistance, but also needs to have a low refractive index so as to ensure that the optical and electrical properties of the photoelectric chip are not affected by the packaging structure. Therefore, the present disclosure uses organic silica gel and UV curable adhesive with high light transmittances to manufacture the sensor 10, which ensures the original optical and electrical properties of the photoelectric chip.

Specifically, in an embodiment, the chip 12 is a photodiode. The photodiode receives an external light signal and converts it into an electrical signal.

More specifically, in an embodiment, a current amplifying chip is further provided on the substrate 11. The current amplifying chip is connected to the photodiode through a micro-connection line, receives an electrical signal of the photodiode, and transmits the electrical signal to another component through the micro-connection line.

Figure 5:
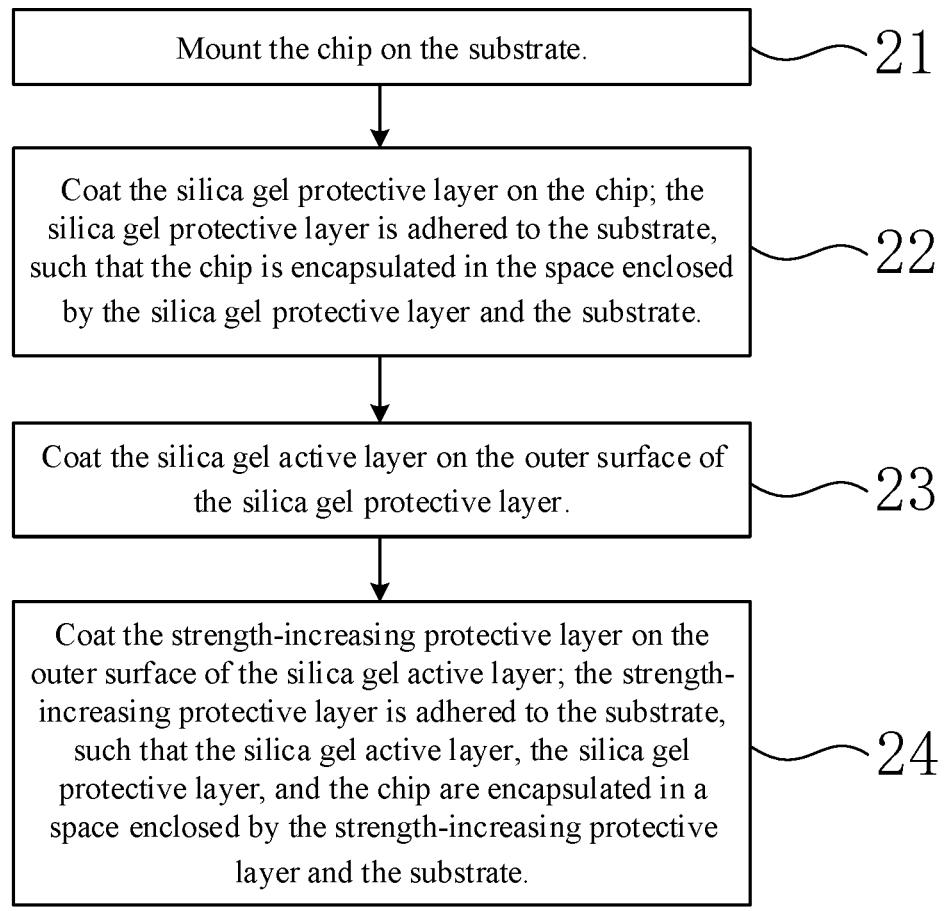
FIG. 5 is a schematic flow chart of a method for manufacturing the sensor according to an embodiment.

FIG. 5 is a schematic flow chart of a method for manufacturing the sensor according to an embodiment. It should be understood that FIG. 5 shows the steps or operations of the method for manufacturing, but these steps or operations are only examples, and the embodiments of the present disclosure may also perform other operations or modifications of each of the operations in FIG. 5.

Further, as shown in FIG. 5, in an embodiment, a method for manufacturing the sensor 10 is provided, which specifically includes the following steps.

In S21, the chip 12 is mounted on the substrate 11.

In S22, the silica gel protective layer 14 is coated on the chip 12. the silica gel protective layer 14 adheres to the substrate 11, such that the chip 12 is encapsulated in the space enclosed by the silica gel protective layer 14 and the substrate 11.

In S23, the silica gel active layer 15 is coated on the outer surface of the silica gel protective layer 14.

In S24, the strength-increasing protective layer 16 is coated on the outer surface of the silica gel active layer 15. The strength-increasing protective layer 16 adheres to the substrate 11, such that the silica gel active layer 15, the silica gel protective layer 14, and the chip 12 are encapsulated in a space enclosed by the strength-increasing protective layer 16 and the substrate 11.

According to the method for manufacturing the sensor 10 provided by the present disclosure, the chip 12 is completely encapsulated in a space enclosed by the protective layer 13 and the substrate 11 to protect the chip 12 and the internal circuits of the chip 12 from external damage, effectively prevent pollutants and moisture in the environment from entering the internal of the chip 12, and resist influence of external impacts and vibrations, thereby improving the stabilities of the optical, mechanical and electrical properties of the sensor 10. Further the surface strength of the sensor 10 is increased and the surface adhesion of the sensor 10 is reduced, thereby improving the dust-proof, abrasion-resistant and scratch-resistant performances of the surface of the sensor 10 and improving the surface quality of the sensor 10, which is convenient for subsequent processing.

Figure 6:
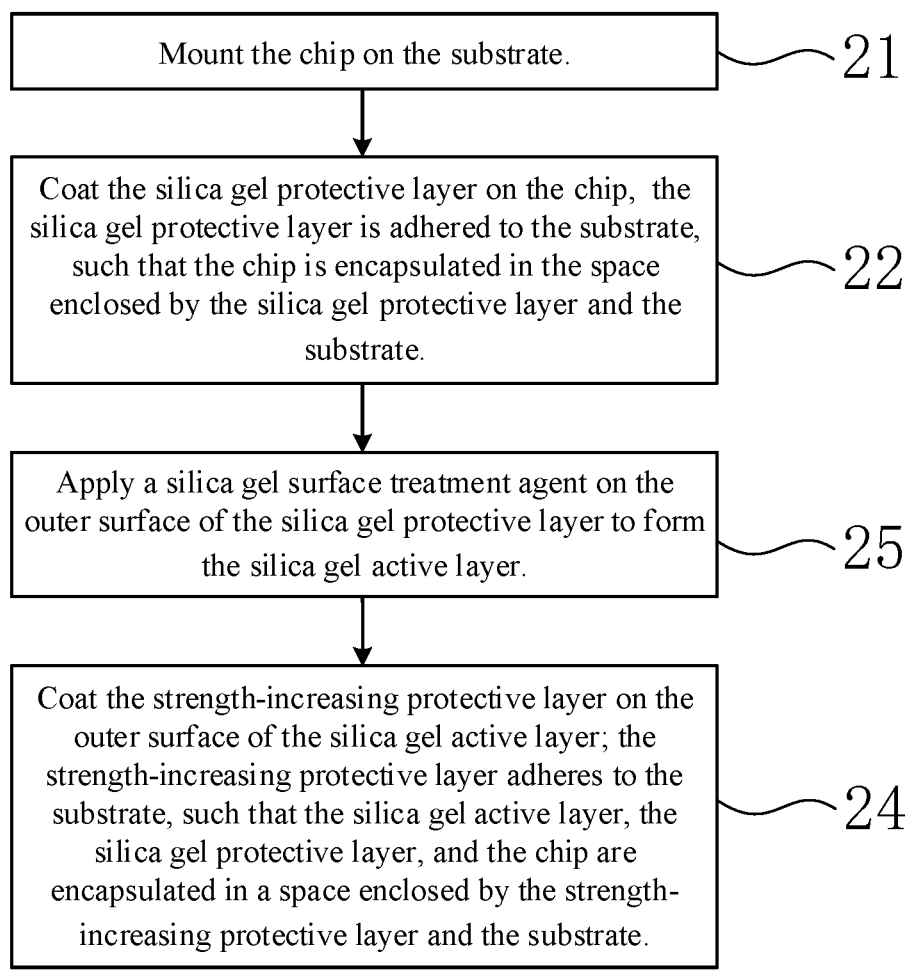
FIG. 6 is a schematic flow chart of a method for manufacturing the sensor according to another embodiment.

FIG. 6 is a schematic flow chart of a method for manufacturing the sensor according to another embodiment. It should be understood that FIG. 6 shows the steps or operations of the method for manufacturing, but these steps or operations are only examples, and the embodiments of the present disclosure may also perform other operations or modifications of each of the operations in FIG. 6.

Further, as shown in FIG. 6, in an embodiment, the method for manufacturing the sensor 10 includes the following steps.

In S21, the chip 12 is mounted on the substrate 11.

In S22, a silica gel protective layer 14 is coated on the chip 12. the silica gel protective layer 14 adheres to the substrate 11, such that the chip 12 is encapsulated in the space enclosed by the silica gel protective layer 14 and the substrate 11.

In S25, a silica gel surface treatment agent is applied on the outer surface of the silica gel protective layer 14 to form the silica gel active layer 15.

In S24, the strength-increasing protective layer 16 is coated on the outer surface of the silica gel active layer 15. The strength-increasing protective layer 16 adheres to the substrate 11, such that the silica gel active layer 15, the silica gel protective layer 14, and the chip 12 are encapsulated in a space enclosed by the strength-increasing protective layer 16 and the substrate 11.

In the description of the present disclosure, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", and the like, indicate that the orientation or positional relationship is based on the orientation or positional relationship shown in the drawings, only to facilitate the description of the present disclosure and simplify the description, rather than indicating or implying the device or elements must have a specific orientation, be constructed and operated in a specific orientation, and therefore cannot be construed as limitation of the present disclosure.

In addition, the terms "first" and "second" are used for purposes of description only, and cannot be understood to indicate or imply relative importance or implicitly indicate the number of technical features indicated. Therefore, the features defined by "first" and "second" may explicitly or implicitly include at least one of the features. In the description of the present disclosure, the meaning of "plurality" is at least two, such as two, three, or more, unless otherwise clearly and specifically defined.

In the present disclosure, unless otherwise clearly specified and defined, the term such as "installed", "interconnected", "connected", "fixed" should be understood in a broad sense, for example, it can be a fixed connection or a detachable connection, or integrated; may be a mechanical connection or an electrical connection; may be a direct connection, or may be an indirect connection through an intermediate, may be a communication between two components or an interaction between two components, unless otherwise specified. Those ordinary skilled in the art can understand the specific meanings of the above terms in the present disclosure according to specific situations.

In the present disclosure, unless otherwise clearly specified and defined, a first feature is "on" or "below" a second feature may be that the first and second features are in direct contact, or the first and second features are indirectly contact through an intermediate. The first feature is "at the top of", "above", and "over" the second feature may indicate that the first feature is directly or obliquely above the second feature, or only indicate that a level height of the first feature is higher than that of the second feature. The expression that a first feature is "beneath", "below", and "under" the second feature may indicate that the first feature is directly or obliquely below the second feature, or only indicates that the horizontal height of the first feature is lower than that of the second feature.

It will be understood that an element, when being referred to as being "fixed", or "disposed" on another element, it may be directly on another element, or there may be an intermediate element between them. When an element is considered to be "connected" to another element, it may be directly connected to another element or there may be an intermediate element between them at the same time. The terms "vertical", "horizontal", "upper", "lower", "left", "right" and similar expressions used herein are for illustrative purposes only and should not be construed as the only implementation.

The technical features of the above embodiments can be combined arbitrarily. For concise description, not all possible combinations of the technical features in the above embodiments are described, but all of which should be considered to be within the scope described in this specification, as long as there is no contradiction between them.

The above described embodiments are merely illustrate several embodiments of the present disclosure, which are described more specifically and in detail, but they cannot be understood as limiting the scope of the present disclosure. It should be noted that, for those ordinary skilled in the art, several variations and improvements may be made without departing from the concept of the present disclosure, and all of which are within the protection scope of the present disclosure. Therefore, the scope of protection of the present disclosure shall be subject to the appended claims.

What is claimed is:

1. A sensor, comprising:
   a substrate;
   a chip that is arranged on a surface of the substrate; and
   a protective layer comprising a silica gel protective layer, a silica gel active layer, and a strength-increasing protective layer;
   wherein the silica gel protective layer is coated on the chip, and the silica gel protective layer adheres to the substrate, such that the chip is encapsulated in a space enclosed by the silica gel protective layer and the substrate;
   wherein the silica gel active layer is coated on an outer surface of the silica gel protective layer, and adhesion of the silica gel active layer is greater than adhesion of the silica gel protective layer;
   wherein the strength-increasing protective layer is coated on and adheres to an outer surface of the silica gel active layer, and the strength-increasing protective layer adheres to the substrate, such that the silica gel active layer, the silica gel protective layer, and the chip are encapsulated in a space enclosed by the strength-increasing protective layer and the substrate; and a strength of the strength-increasing protective layer is greater than a strength of the silica gel protective layer.

2. The sensor according to claim 1, wherein:
   the silica gel protective layer comprises organic silica gel, the organic silica gel is coated on the chip, and the organic silica gel adheres to the substrate, such that the chip is encapsulated in a space enclosed by the organic silica gel and the substrate; and/or a surface hardness of the silica gel protective layer is Shore A60-A80.

3. The sensor according to claim 1, wherein the silica gel active layer is formed by applying a silica gel surface treatment agent on the outer surface of the silica gel protective layer.

4. The sensor according to claim 1, wherein the strength-increasing protective layer comprises a UV curable adhesive, the UV curable adhesive is coated on and adheres to the outer surface of the silica gel active layer, and the UV curable adhesive adheres to the substrate, such that the silica gel active layer, the silica gel protective layer and the chip are encapsulated in a space enclosed by the UV curable adhesive and the substrate.

5. The sensor according to claim 4, wherein:
a surface hardness of the strength-increasing protective layer is Shore D70-D90; and/or
the strength-increasing protective layer comprises an acrylic UV curable adhesive.

6. The sensor according to claim 4, wherein the UV curable adhesive comprises an acrylic UV curable varnish or acrylic conformal varnish.

7. The sensor according to claim 1, wherein:
the silica gel protective layer is coated on the chip and adheres to the substrate by injection molding; and/or
the silica gel active layer is coated on the silica gel protective layer by brushing or spraying, the strength-increasing protective layer is coated on the silica gel active layer and adheres to the substrate by spraying, dipping, brushing or drenching.

8. The sensor according to claim 1, wherein:
a thickness of the silica gel protective layer is 0.55 mm-0.65 mm, a thickness of the silica gel active layer is 0.05 mm-0.15 mm, and a thickness of the strength-increasing protective layer is 0.1 mm-0.2 mm; and/or
a refractive index of the protective layer is 1.4-1.8, a temperature resistance range of the protective layer is $-30°$ C.-$280°$ C., and abrasion resistance of the protective layer is RCA for 500 times under 175 g force.

9. The sensor according to claim 1, wherein the chip is a photoelectric chip.

10. A method for manufacturing the sensor according to claim 1, the method comprising:
mounting the chip on the substrate;
coating the silica gel protective layer on the chip, wherein the silica gel protective layer adheres to the substrate, such that the chip is encapsulated in the space enclosed by the silica gel protective layer and the substrate;
coating the silica gel active layer on the outer surface of the silica gel protective layer; and
coating the strength-increasing protective layer on the outer surface of the silica gel active layer, and wherein the strength-increasing protective layer adheres to the substrate, such that the silica gel active layer, the silica gel protective layer, and the chip are encapsulated in a space enclosed by the strength-increasing protective layer and the substrate.

11. The method according to claim 10, wherein the coating the silica gel active layer on the outer surface of the silica gel protective layer comprises:
applying a silica gel surface treatment agent on the outer surface of the silica gel protective layer to form the silica gel active layer.

12. The method according to claim 10, wherein:
the silica gel protective layer comprises organic silica gel, the organic silica gel is coated on the chip, and the organic silica gel adheres to the substrate, such that the chip is encapsulated in a space enclosed by the organic silica gel and the substrate; and/or
a surface hardness of the silica gel protective layer is Shore A60-A80.

13. The method according to claim 10, wherein the strength-increasing protective layer comprises a UV curable adhesive, the UV curable adhesive is coated on and adheres to the outer surface of the silica gel active layer, and the UV curable adhesive adheres to the substrate, such that the silica gel active layer, the silica gel protective layer and the chip are encapsulated in a space enclosed by the UV curable adhesive and the substrate.

14. The method according to claim 13, wherein:
a surface hardness of the strength-increasing protective layer is Shore D70-D90; and/or
the strength-increasing protective layer comprises an acrylic UV curable adhesive.

15. The method according to claim 13, wherein the UV curable adhesive comprises an acrylic UV curable varnish or acrylic conformal varnish.

16. The method according to claim 10, wherein:
the silica gel protective layer is coated on the chip and adheres to the substrate by injection molding; and/or
the silica gel active layer is coated on the silica gel protective layer by brushing or spraying, the strength-increasing protective layer is coated on the silica gel active layer and adheres to the substrate by spraying, dipping, brushing or drenching.

17. The method according to claim 10, wherein:
a thickness of the silica gel protective layer is 0.55 mm-0.65 mm, a thickness of the silica gel active layer is 0.05 mm-0.15 mm, and a thickness of the strength-increasing protective layer is 0.1 mm-0.2 mm; and/or
a refractive index of the protective layer is 1.4-1.8, a temperature resistance range of the protective layer is $-30°$ C.-$280°$ C., and abrasion resistance of the protective layer is RCA for 500 times under 175 g force.

18. The method according to claim 10, wherein the chip is a photoelectric chip.

* * * * *